United States Patent [19]
Chittipeddi et al.

[11] Patent Number: 5,798,300
[45] Date of Patent: Aug. 25, 1998

[54] METHOD FOR FORMING CONDUCTORS IN INTEGRATED CIRCUITS

[75] Inventors: Sailesh Chittipeddi, Austin, Tex.; Sailesh Mansinh Merchant, Orlando, Fla.

[73] Assignee: Lucent Technologies Inc., Murray Hill, N.J.

[21] Appl. No.: 857,079

[22] Filed: May 15, 1997

Related U.S. Application Data

[63] Continuation of Ser. No. 499,509, Jul. 7, 1995, abandoned.
[51] Int. Cl.$^6$ ............................................. H01L 21/28
[52] U.S. Cl. ..................... 438/627; 438/647; 438/645; 438/648; 438/688; 204/192.17
[58] Field of Search ....................... 438/636, 627, 438/628, 642, 645, 644, 648, 688, 647; 204/192.17, 192.23

[56] References Cited

U.S. PATENT DOCUMENTS

| | | | |
|---|---|---|---|
| 5,171,412 | 12/1992 | Talieh et al. | 204/192.15 |
| 5,219,788 | 6/1993 | Abernathy et al. | 437/187 |
| 5,266,521 | 11/1993 | Lee et al. | 438/642 |
| 5,356,836 | 10/1994 | Chen et al. | 437/195 |
| 5,358,616 | 10/1994 | Ward | 437/194 |
| 5,401,675 | 3/1995 | Lee et al. | 437/195 |
| 5,403,779 | 4/1995 | Joshi et al. | 437/195 |
| 5,427,666 | 6/1995 | Mueller et al. | 437/192 |
| 5,470,790 | 11/1995 | Myers et al. | 438/688 |
| 5,563,099 | 10/1996 | Grass | 438/636 |
| 5,604,157 | 2/1997 | Dai et al. | 437/200 |

FOREIGN PATENT DOCUMENTS

07022415  1/1995  Japan.

OTHER PUBLICATIONS

Nolscher et al, "High contrast single layer resists and antireflection layers—an alternative to multilayer resist techniques", SPIE vol. 1086, Advances in Resist Technology and Processing VI, pp. 242–250, 1989.

S. Wolf "Silicon Processing for the VLSI Era, vol. 2", Lattice Press, pp. 268–271, 1990.

"Development of a Coherent Ti/Tin Process for Sub–Half Micron Technologies", Ramaswami et al, M.R.S. Conf. Proc., pp. 215–221, 1994.

"Barrier Layers for ULSI Metallization", Sandhu, M.R.S. Conf. Proc., pp. 183–189, 1994.

J.J. Hsieh and R.V. Joshi, Collimated Line: Process Modeli and Materials Characteristics, 1994 Materials Research Society Conference Proceedings, pp. 207–213.

Publication No. JP7022415, Patent Abstracts of Japan, Jan. 24, 1995, p. 1 of 1.

Collimated Liners: Process Modeling and Material Characteristics J.J. Hsieh and R. V. Joshi IBM T.J. Watson Research Center, P. O. Box 218, Yorktown Heights, New York 10598.

*Primary Examiner*—John Niebling
*Assistant Examiner*—Thomas G. Bilodeau
*Attorney, Agent, or Firm*—John T. Rehberg

[57] ABSTRACT

A method of forming electromigration resistant integrated circuit runners is disclosed. A collimated beam of particles is directed toward a substrate to form a metal nucleating layer. Then a non-collimated beam is used to form the rest of the metal layer. Then the layers are patterned to form runners.

10 Claims, 1 Drawing Sheet

METHOD FOR FORMING CONDUCTORS IN INTEGRATED CIRCUITS

This is a continuation of application 08/499,509, filed Jul. 7, 1995, now abandoned.

TECHNICAL FIELD

This invention relates to semiconductor integrated circuits and methods for their fabrication.

BACKGROUND OF THE INVENTION

Typical modern integrated circuits utilize metallic conductors to connect individual transistors. Often, the conductors are made from aluminum. Many integrated circuits manufacturing processes require that an opening, sometimes termed a "via" be formed in a dielectric layer. The via is then filled with aluminum. The aluminum in the via usually contacts another aluminum conductor or a semiconductor substrate.

As via dimensions shrink in advanced semiconductor manufacturing processes, it becomes increasingly difficult to deposit aluminum within small vias. In an attempt to solve this problem, some manufacturers perform two-step depositions of aluminum. A first aluminum deposition is performed at a low temperature, thereby providing small aluminum grains. A subsequent aluminum deposition is performed at a higher temperature, thereby providing larger grains. Both depositions are performed utilizing standard aluminum sputtering techniques. However, this process does not always provide acceptable control of grain growth. Conductors which are formed by this technique may be susceptible to electromigration failures due to the lack of control over grain growth.

Others have attempted to utilize an aluminum sputtering process with a collimated aluminum beam. The aluminum beam is collimated utilizing a grid which may or may not be at a finite potential between a sputtering target and the substrate. Consequently, a focused beam of aluminum can be deposited within the via. However, collimated aluminum deposition is very slow and impractical for mass production use. Furthermore, a great deal (as much as one-third) of the aluminum is deposited on the grid, resulting in wasted material, increased cost and reduced throughput. In addition, electromigration resistance of the deposited film is also suspect.

Consequently, those concerned with the development of integrated circuit mass manufacturing processes, have continued to search for better techniques for the deposition of aluminum.

SUMMARY OF THE INVENTION

An improved method of integrated circuit fabrication includes:

forming a layer overlying a substrate by directing a collimated beam of conductive particles at said substrate, thereby forming a first conductive layer, and then sputtering non-collimated, conductive particles at said substrate, thereby forming a second conductive layer contacting said first conductive layer.

DETAILED DESCRIPTION

Figure 1:
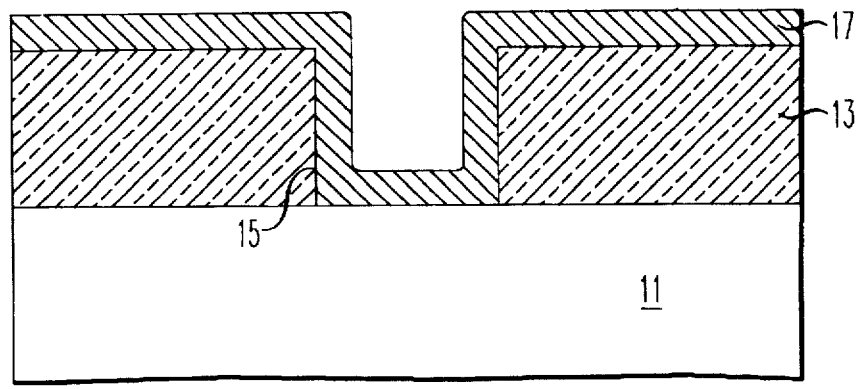
FIGS. 1, 2, and 3 are cross-sections of partially fabricated integrated circuits which are useful in understanding an illustrative embodiment of the present invention.

In FIG. 1, reference numeral 11 denotes a substrate which may be a conductor, illustratively aluminum, or a semiconductor, illustratively, silicon, doped silicon, or epitaxial silicon, etc. Alternatively, reference numeral 11 may denote a silicide, a conducting nitride, or any other conducting material. Reference numeral 13 denotes a dielectric which, illustratively, may be a form of doped or undoped silicon dioxide. Reference numeral 15 denotes an opening, or via, formed within dielectric 13, thereby exposing conductor 11.

A thin layer of aluminum, 17, is deposited using collimating apparatus. In other words, a sputtering apparatus typically having a collimated beam of aluminum. It will be noted that aluminum layer 17 is very conformal and typically has small, uniformly controllable grains. By way of example, in a via having dimensions of 0.25 μm wide by 0.5 μm high, the thickness of layer 17 (within the field of the collimator) might be 50–5000Å. Other suitable examples of via dimensions might be 0.5 μm wide by 2.0 μm high or 0.25 μm wide by 2.0 μm high. Similar aluminum thicknesses are appropriate for these other vias.

Figure 2:
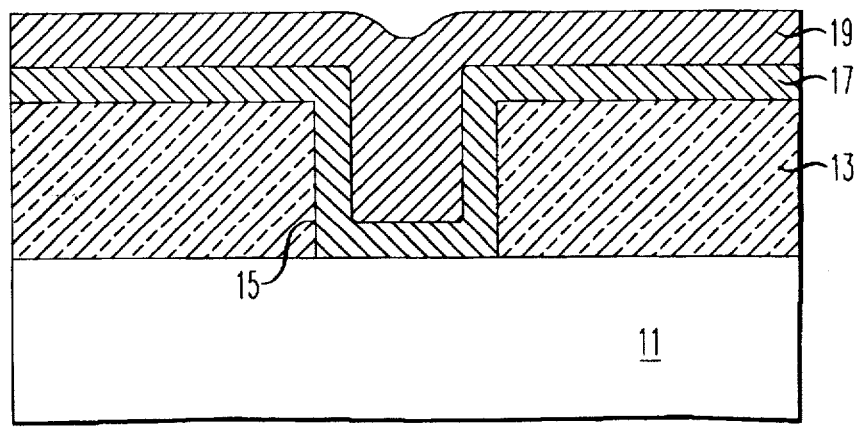

Turning to FIG. 2, a second aluminum deposition is performed, utilizing standard sputtering apparatus. It is not necessary to collimate the aluminum beam to deposit layer 19. Consequently, the disadvantages of prolonged collimated aluminum deposition are avoided. However, excellent conformality may be obtained because of the presence of the original nucleating layer 17. Typically, in the aforementioned example, the thickness of layer 19 might be 2 kÅ to 10 kÅ.

Typically, layer 17 may be deposited at a temperature between room temperature and 200° C. Layer 19 may be deposited at a temperature of 100° to 575° C. The inventive process provides good grain size control and the resulting patterned runners have good resistance to electromigration. (Layers 17 and 19 are patterned together to form a conductive runner.)

Figure 3:
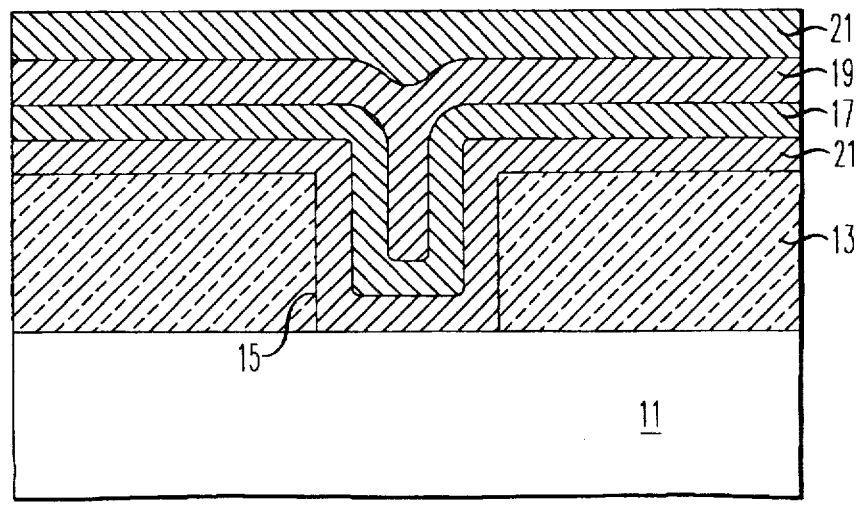

Of course, other layers may be formed before and after the aluminum conductor. In FIG. 3, window 15 is depicted in dielectric 13. Reference numeral 11 denotes any conductive material. Reference numeral 21 may denote titanium nitride, a refractory metal silicide, or a metal such as titanium. (If reference numeral 21 denotes a metal such as titanium, it may be reacted with an underlying silicon substrate, should reference numeral 11 denote a silicon substrate.) Reference numeral 21 may denote a bilayer of, for example, titanium nitride formed upon titanium or vice versa. (Borides may be used in place of nitrides in layer 21.)

Reference numeral 17 denotes an aluminum layer formed by collimated deposition, as described above. Reference numeral 19 denotes an aluminum layer formed by typical sputter deposition, as previously discussed. Reference numeral 21 denotes an overlying conductive (or insulative) layer. If layer 21 is conductive, it may be, for example, any of the previously mentioned conductive materials, such as Ti, TiN, a refractory metal silicide, polysilicon, etc. Layer 21 may be a conductive bilayer of, for example, Ti and TiN.

Those skilled in the art may wish to modify the thicknesses of layers 17 and 19 depending upon the dimensions of via 15 and its aspect ratio. Thus, the ratio of collimated aluminum deposition to non-collimated aluminum deposition may be varied depending on circumstances. Layers 17 and 19 may be patterned (possibly together with any overlying or underlying conductive layers) to form runners. Should via 15 be filled with a plug made, for example, from tungsten, overlying runners may be made from uncollimated-over-collimated aluminum.

The invention claimed is:

1. A method of integrated circuit fabrication comprising:

forming a layer overlying a substrate by:

directing a collimated beam of aluminum particles at said substrate, thereby forming a first conductive layer;

then sputtering non-collimated aluminum particles at said substrate, thereby forming a second conductive layer contacting said first conductive layer; and depositing a third conductive layer of polysilicon over said second conductive layer such that said third conductive layer contacts said second conductive layer.

2. The method of claim 1 further including the step of forming a conductive runner by patterning said first and second layers together.

3. The method of claim 1 in which said first conductive layer has a thickness of 50–5000Å.

4. The method of claim 1 in which said second conductive layer has a thickness of 2 kÅ–10 kÅ.

5. The method of claim 1 in which said substrate is conductive and said substrate is partially covered by a dielectric, said dielectric having vias which expose portions of said substrate and in which said first and second conductive layers substantially fill said via and cover said dielectric.

6. The method of claim 1 further including the steps of forming one or more conductive layers between said substrate and said first conductive layer.

7. The method of claim 6 in which said conductive layer is chosen from the group consisting of titanium nitride, a refractory metal silicide and titanium.

8. The method of claim 6 further including the step of forming a bilayer before forming said first conductive layer.

9. The method of claim 8 in which said bilayer is titanium nitride overlying titanium.

10. The method of claim 1 further including the step of forming at least one conductive layer over said second conductive layer.

* * * * *